(12) United States Patent
Stoerk et al.

(10) Patent No.: US 8,373,495 B2
(45) Date of Patent: Feb. 12, 2013

(54) SELF BIASED GATE CONTROLLED SWITCH

(75) Inventors: Carsten I. Stoerk, Freising (DE); Joerg T. Kirchner, Mauern (DE)

(73) Assignee: Texas Instruments Deutschland GmbH, Freising (DE)

(*) Notice: Subject to any disclaimer, the term of this patent is extended or adjusted under 35 U.S.C. 154(b) by 212 days.

(21) Appl. No.: 12/770,493

(22) Filed: Apr. 29, 2010

(65) Prior Publication Data
US 2010/0277220 A1    Nov. 4, 2010

(30) Foreign Application Priority Data
Apr. 30, 2009  (DE) .................... 10 2009 019 654

(51) Int. Cl.
*H03K 17/687*    (2006.01)
(52) U.S. Cl. ........................ 327/437; 327/436
(58) Field of Classification Search .......... 327/379, 327/387–389, 392–402, 427, 434, 436, 437
See application file for complete search history.

(56) References Cited

U.S. PATENT DOCUMENTS

| 5,574,633 | A | 11/1996 | Prater |
| 6,917,236 | B2* | 7/2005 | Doutreloigne et al. ........ 327/333 |
| 7,253,589 | B1* | 8/2007 | Potanin et al. ................ 320/138 |

FOREIGN PATENT DOCUMENTS

JP    09027742    1/1997

OTHER PUBLICATIONS

DE Search Report.

* cited by examiner

*Primary Examiner* — Lincoln Donovan
*Assistant Examiner* — Diana J Cheng
(74) *Attorney, Agent, or Firm* — Alan A. R. Cooper; Wade J. Brady, III; Frederick J. Telecky, Jr.

(57) ABSTRACT

Conventional current sharing circuits, which can be used in drivers for liquid crystal displays (LCDs), for example, often use bipolar transistors. However, bipolar transistors are not available in many CMOS processes. Thus, a current sharing circuit is provided here that employs CMOS transistors. In particular, the circuit provided here uses a current mirror and pass circuit to assist in providing this current sharing function.

16 Claims, 5 Drawing Sheets

SELF BIASED GATE CONTROLLED SWITCH

CROSS-REFERENCE TO RELATED APPLICATIONS

This application is claims priority from German Patent Application No. 10 2009 019 564.4, filed Apr. 30, 2009, which is hereby incorporated by reference for all purposes.

TECHNICAL FIELD

The invention generally relates to an integrated circuit (IC) with a switch that is controlled through a self biased control gate and a method.

BACKGROUND

Figure 1:
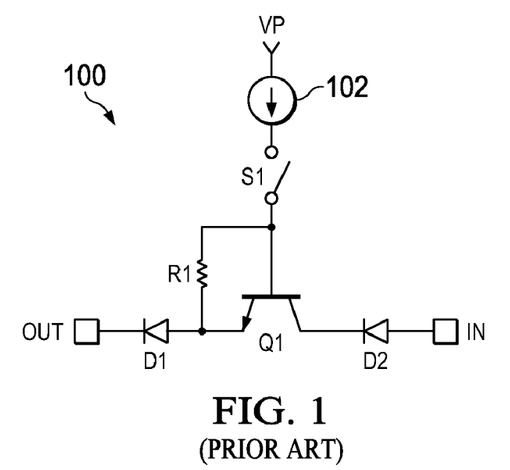
FIG. 1 is a circuit diagram of a conventional charge sharing circuit.

Turning to FIG. 1 of the drawings, the reference numeral 100 generally designates a conventional charge sharing circuit. Circuit 100 generally comprises current source 102, diodes D1 and D2, resistor R1, switch 51, and NPN transistor Q1. Diode D1 is coupled between output pin OUT and the emitter of transistor Q1, while diode D2 is coupled between input pin IN and the collector of transistor Q1. Switch S1 and a current source 102 are coupled in series between the base of transistor Q1 and a voltage supply (which provides a supply voltage VP). Additionally, resistor R1 is coupled between the base and emitter of transistor Q1. If the switch 51 is closed (conducting) a current can flow from the input pin IN to the output pin OUT through diodes D1 and D2 as well as the channel of the transistor Q1. Otherwise, current does not flow from the input pin IN to the output pin OUT when switch S1 is open.

This circuit 100, however, has several disadvantages. For example, circuit 100 employs bipolar transistors, which are not available in many CMOS processes. Furthermore, there can be a charge injection from the power supply (which supplies voltage VP) to the output pin OUT that can reduce the efficiency of the circuit and the charge can only flow in one direction.

Therefore, there is a need for an improved charge sharing circuit.

Some examples of other conventional circuits are: Japanese Patent Appl. No. JP09-027,742; and U.S. Pat. No. 5,574,633.

SUMMARY

In an aspect of the invention, an apparatus is provided, which comprises a charge sharing stage. The charge sharing stage may comprise a first MOS transistor which is coupled with a channel between the first pin and the second pin of the apparatus for temporarily allowing a charge to flow from the first pin to the second pin. A control gate of the first MOS transistor is coupled to receive a voltage which is at least a MOS transistor threshold voltage greater or lower than a source voltage of the first MOS transistor in a self-biasing control loop. The first MOS transistor may be a PMOS. The control gate of the first PMOS transistor may then be coupled to receive a voltage which is at least a MOS transistor threshold voltage lower than the source voltage of the PMOS transistor. The first MOS transistor may also be a NMOS transistor. The control gate of the first NMOS transistor may then be coupled to receive a voltage which is at least a MOS transistor threshold voltage greater than the source voltage of the NMOS transistor. The self-biasing control loop serves to provide a respective voltage level to the control gate of the first MOS transistor for turning the transistor on. The voltage level may be increased or decreased so as to include an overdrive voltage for reducing the ON resistance of the first MOS transistor. These aspects of the invention provide a self-biased MOS switch allowing charge sharing between two separate pins of an apparatus. The control gate is automatically kept at least one MOS threshold voltage away from the source voltage level. Further, this aspect of the invention is applicable to any voltage and/or charge difference between two pins. The first MOS transistor may also be implemented with a relatively thin gate oxide despite rather large voltages on the first or the second pin. This saves chip area and production costs.

In an aspect of the invention, the charge sharing circuit may comprise a second MOS transistor and a current minor for implementing the self biasing control loop. The second MOS transistor may then be coupled with its control gate to the source of the first MOS transistor. The channel of the second MOS transistor may then be coupled to a first current path of the current mirror. A second current path of the current mirror may then be coupled to the control gate of the first MOS transistor. The current mirror can then be configured to provide a control voltage level to the control gate of the first MOS transistor which is at least a MOS threshold voltage of the second MOS transistor greater than the voltage level at the source of the first MOS transistor.

If the first MOS transistor is an NMOS transistor, the second MOS transistor may be a PMOS transistor and vice versa. For an NMOS transistor as first MOS transistor, the current mirror may comprise two NMOS transistors. The PMOS transistor (second MOS transistor) may then be coupled with its control gate to the source of the NMOS transistor (first MOS transistor), with its drain to a negative supply voltage and with its source to a first side of the current mirror. A second side of the current mirror can then be coupled to the control gate of the NMOS transistor (first MOS transistor). This aspect of the invention provides an automatic self-biasing circuit for a MOS transistor, which is coupled with its channel between two pins. Due to the very high impedance of the control gates of the MOS transistors, the charge injection from the power supply into any of the two pins is prevented.

In an aspect of the invention, a switch may be provided which can be coupled between a positive supply voltage and the current mirror so as to selectively enable and disable a current through the current mirror and the channel of the second MOS transistor. The apparatus may also comprise switches coupled between a negative supply voltage and the control gate and/or the source of the first MOS transistor for selectively turning the first MOS transistor off. The charge sharing function can then be selectively turned on and off. The power consumption is minimum during the OFF-state.

The charge sharing stage may also comprise a third MOS transistor. The third MOS transistor may be coupled with its channel in series to the first MOS transistor. The third MOS transistor may then be diode coupled. This aspect provides unidirectional current flow and/or different slew rates dependent on the direction of the charge flow.

In another embodiment, the control gate of the third MOS transistor may be coupled to the control gate of the first MOS transistor so as to receive the same control voltage level. This provides that the first and the third MOS transistor are self-biased through a self-biasing control loop. The charge sharing stage can then automatically adapt to varying voltage levels and/or charges at the first and the second pins.

If the first MOS transistor is an NMOS transistor, the third MOS transistor may also be an NMOS transistor. The first MOS transistor may then be coupled with its drain to the second pin and the third MOS transistor may be coupled with its control gate to the control gate of the first MOS transistor and with its source to the source of the first MOS transistor. The drain of the third MOS transistor may then be coupled to the first pin.

The invention also provides a method of sharing a charge between a first and a second pin of an apparatus. The first and the second pin may then be selectively coupled through the channel of a first MOS transistor. The control gate of the first MOS transistor may be self-biased with a control loop so as to receive a control voltage level which is at least one MOS transistor threshold voltage greater/lower than a source voltage of the MOS transistor. The control voltage level may be provided by mirroring a current through a second MOS transistor to the control gate of the first MOS transistor. The control gate of the second MOS transistor may be coupled to a source of the first MOS transistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 2:
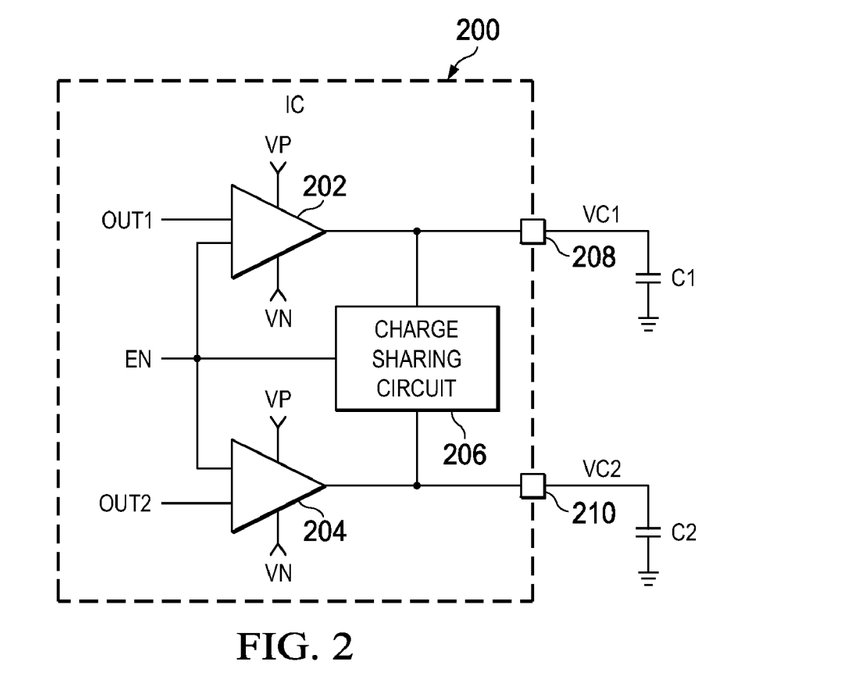
FIG. 2 is a circuit diagram of an example of an IC in accordance with a preferred embodiment of the present invention.

In FIG. 2, an IC 200 in accordance with a preferred embodiment of the present invention can be seen. For example, IC 200 may be used for driving a liquid crystal display (LCD). IC 200 generally comprises buffers 202 and 204 and charge sharing circuit 206. Generally, buffers 202 and 204 can be used for buffering output signals OUT1 and OUT2, respectively, that can serve to establish output voltages VC1 and VC2 on capacitor C1 and C2 through pins 208 and 210. The charge sharing circuit 206 is also coupled to pin 208 and 210. Additionally, an enable signal EN is provided to the buffers 202 and 204 (to enable a high impedance state) and to charge sharing circuit 206 (to enable a charge sharing state).

Figure 3:
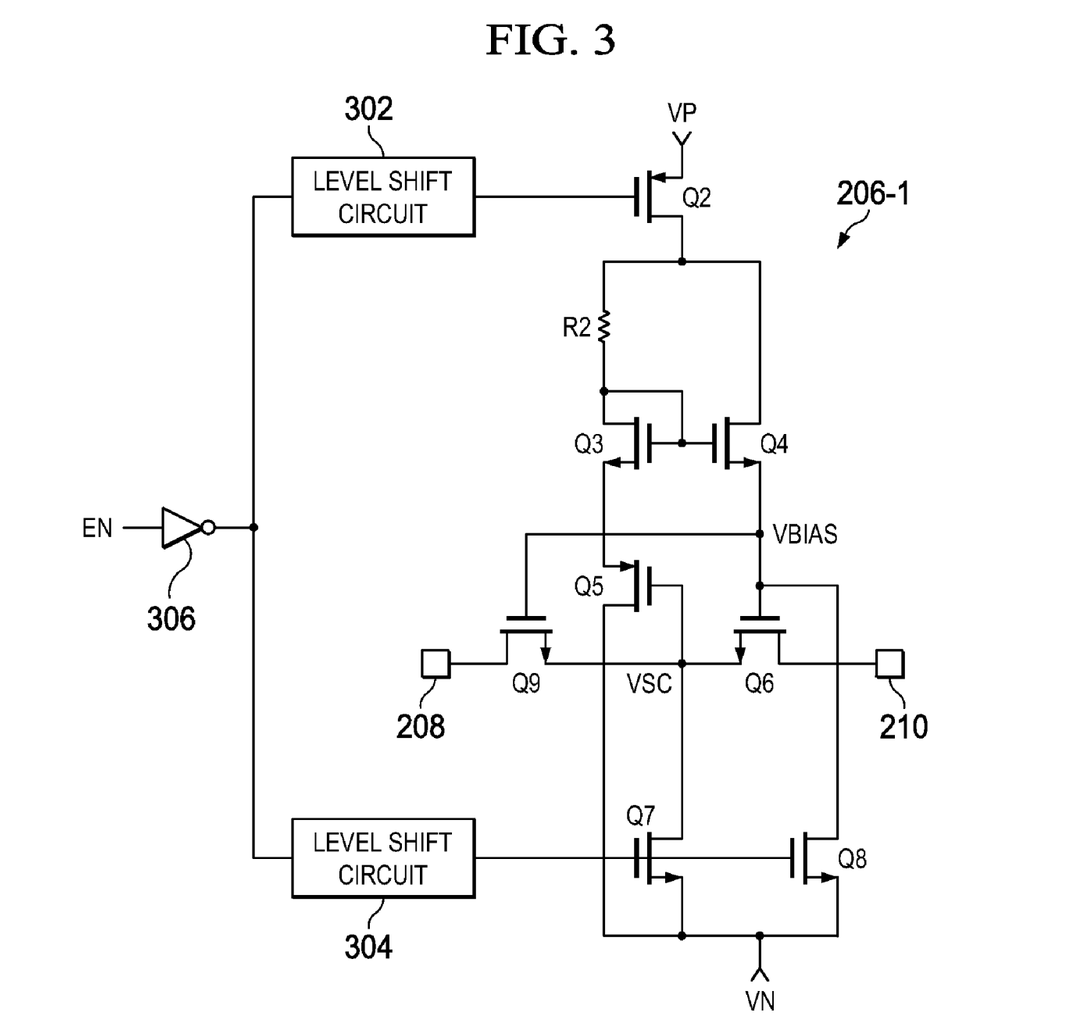
FIG. 3 is a circuit diagram of an example of the charge sharing circuit of FIG. 2.

Turning to FIG. 3, an example of the charge sharing circuit 206 can be seen, which is referred to as charge sharing circuit 206-1. Charge sharing circuit 206-1 generally comprises inverter 306, level shift circuits 302 and 304, resistor R2, and MOS transistors Q2 through Q9. In this configuration, PMOS transistors Q6 and Q9 are coupled in series with one another between pins 208 and 210. The gates of transistors Q6 and Q9 are biased to voltage VBIAS. This bias voltage VBIAS is established and maintained through a self-biasing control loop which generally includes PMOS transistor Q5 and a current mirror. The current mirror generally includes transistors Q3 and Q4 and resistor R2 (which generally serves to limit the steering current ID1). Therefore, resistor R2 can be dimensioned so as to limit the slew rate of the charge sharing process and also determines the over drive voltage of transistors Q6 and Q9. The pass-transistors Q6 and Q9 gate-source voltage can then be determined as:

$$VBIAS - VSC = VTH\_Q5 + VEFF\_Q5 + VTH\_Q3 + VEFF\_Q3 - VTH\_Q4, \quad (1)$$

where VTH is the threshold voltage of the indicated transistor and VEFF is the effective overdrive voltage of the respective transistor. The overdrive voltage VEFF depends on the current gain β and the current ID1 according to the approximation:

$$VEFF \approx \sqrt{2 \times \frac{ID1}{\beta}} \quad (2)$$

If the current ID1 is chosen very low and the thresholds of transistors Q3 and Q4 are generally the same, gate-source voltages of pass-transistors Q6 and Q9 is determined through the threshold voltage of transistor Q5. Advantageously, the threshold voltage of transistor Q5 may be chosen to be high (for example, 3V or higher), which provides high overdrive with respectively low current consumption.

Additionally, the current minor is then coupled together and to a transistor Q2 which serves to couple the current mirror to a supply voltage VP. Transistor Q2 is controlled through a level shifter 302 which receives an inversion of charge enabling signal EN (from inverter 306). The gates and sources of transistors Q6 and Q9 may be coupled to ground through transistors Q7 and Q8 which are controlled with level shifter 304, which receives an inversion of charge enabling signal EN (from inverter 306).

If the enable signal EN is low, the charge sharing circuit 206-1 is turned off. Transistor Q2 is turned off (not conducting) and transistors Q7 and Q8 are turned on (conducting). Bias voltage VBIAS and source voltages VSC are pulled to the negative supply voltage VN. The charge sharing between terminals 208 and 210 is then disabled, where transistors Q9 and Q6 are turned off so that no current can flow between pins 208 and 210.

If the enabling signal EN is high, transistor Q2 is turned on (conducting) and transistors Q7 and Q8 are turned off. Charge may then flow between pins 208 and pin 210. Generally, if the charge sharing circuit 206-1 is turned on, terminals 208 and 210 are connected through transistors Q9 and Q10. In this situation, current ID1 can flow through the channel of transistor Q5. The source voltage of transistor Q5 is then at least one threshold voltage of this MOS transistor TP1 greater than the source voltage VSC on the sources of transistors Q6 and Q9, respectively. The current minor (transistors Q3 and Q4) provides that the source voltage of transistor Q5 is mirrored as control voltage level VBIAS (advantageously including an additional voltage drop as gate overdrive voltage) to the control gates of transistors Q9 and Q6. The voltage VBIAS on the control gates of transistors Q6 and Q9 is therefore always at least one threshold voltage level greater than the source voltage VSC of the two transistors Q9 and Q6. The gate source voltage (which is VBIAS−VGS) can be increased to include an overdrive voltage, as described with equation (1) above. This provides that the transistors are self-biased and always turned on, irrespective of the voltage levels on pins 208 and 210. It also provides that currents or charge can flow between pins 208 to 210. The current ID1 flows through the channel of transistor Q5 and then to the negative supply voltage VN.

Figure 4:
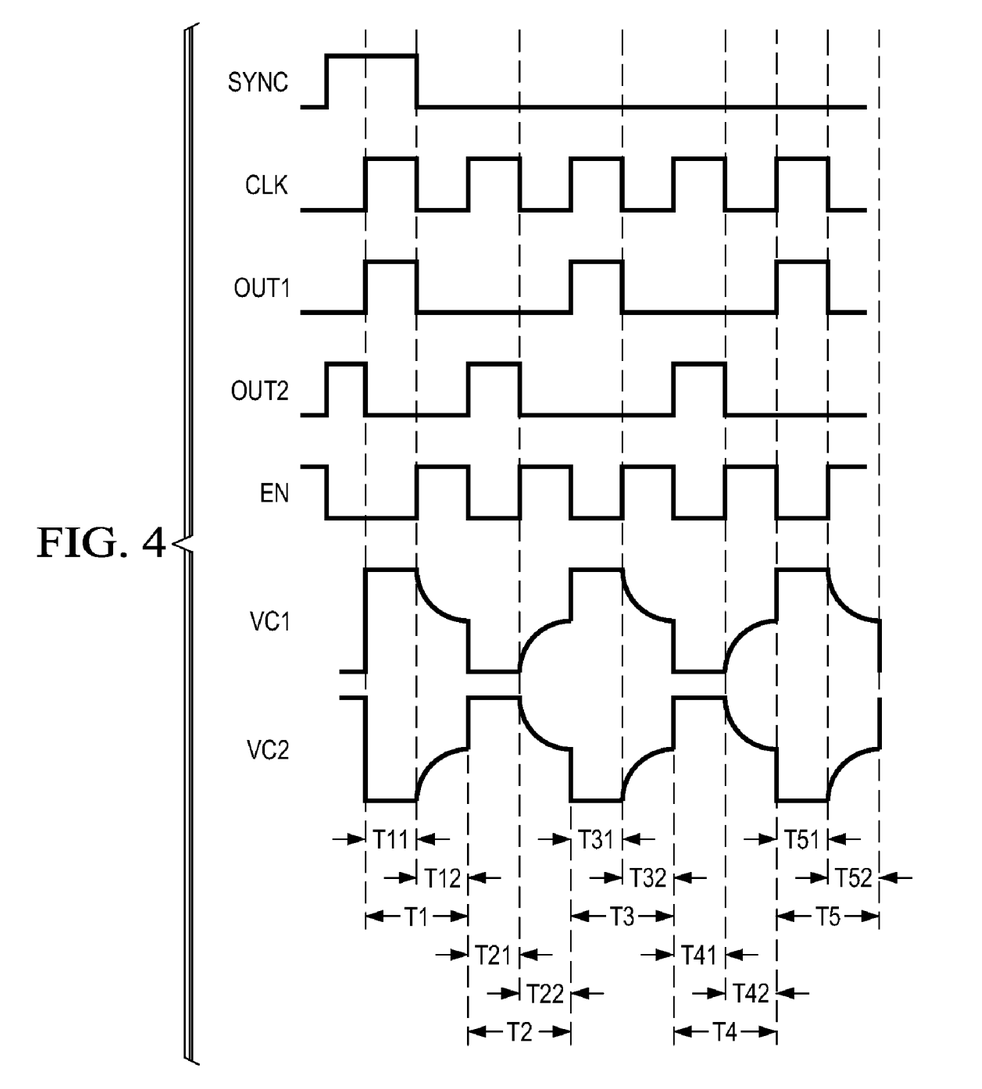
FIG. 4 shows waveforms relating to IC of FIG. 1 using the charge sharing circuit of FIG. 2.

Turning now to FIG. 4, waveforms relating to IC 200 using current sharing circuit 206-1 can be seen. Here, the waveforms may relate to an IC 200 configured to drive an LCD. The voltages on pins 208 and 210 (VC1, VC2) may then be particularly high voltage levels. FIG. 4 shows five clocks cycles T1 to T5. Each of the clock cycles T1 to T5 is divided into two half cycles T11, T12 to T51, T52, respectively. The IC 200 may be initialized with a synchronizing pulse illustrated with a high pulse of signal SYNC. The IC 200 may then operate synchronously to the clock signal CLK. During each period T1 to T5 of clock signal CLK, either capacitor C1 or capacitor C2 may be charged to a high voltage level, which is shown as signals VC1 and VC2. As the first driving signal OUT1 is high during the first half cycle T11 of clock signal CLK, the voltage level VC1 on capacitor C1 is also high. A high pulse of charge enabling signal EN during the second half cycles T12, T22, T32, T42, T52 provides that the charge sharing stage is enabled. This means that charge can flow from 208 (i.e. from capacitor C1 through transistors TN1A, TN1B to capacitor C2) to 210 or vice versa, during each second half cycle. Accordingly, the voltage level VC1 on capacitor C1 falls by the same amount by which the voltage level VC1 on capacitor C2 rises and vice versa. During the second clock period T2, the voltage level VC2 is high and the charge flows in the opposite direction as during the first clock cycle T1. This procedure continues during the following clock cycles 3, 4 and 5 always alternating the direction of the current through the charge sharing stage from clock cycle to clock cycle. Since a certain amount of charge is always supplied to (i.e., shared with) the respective other capacitor (C1 or C2), significant power savings can be achieved.

Figure 5:
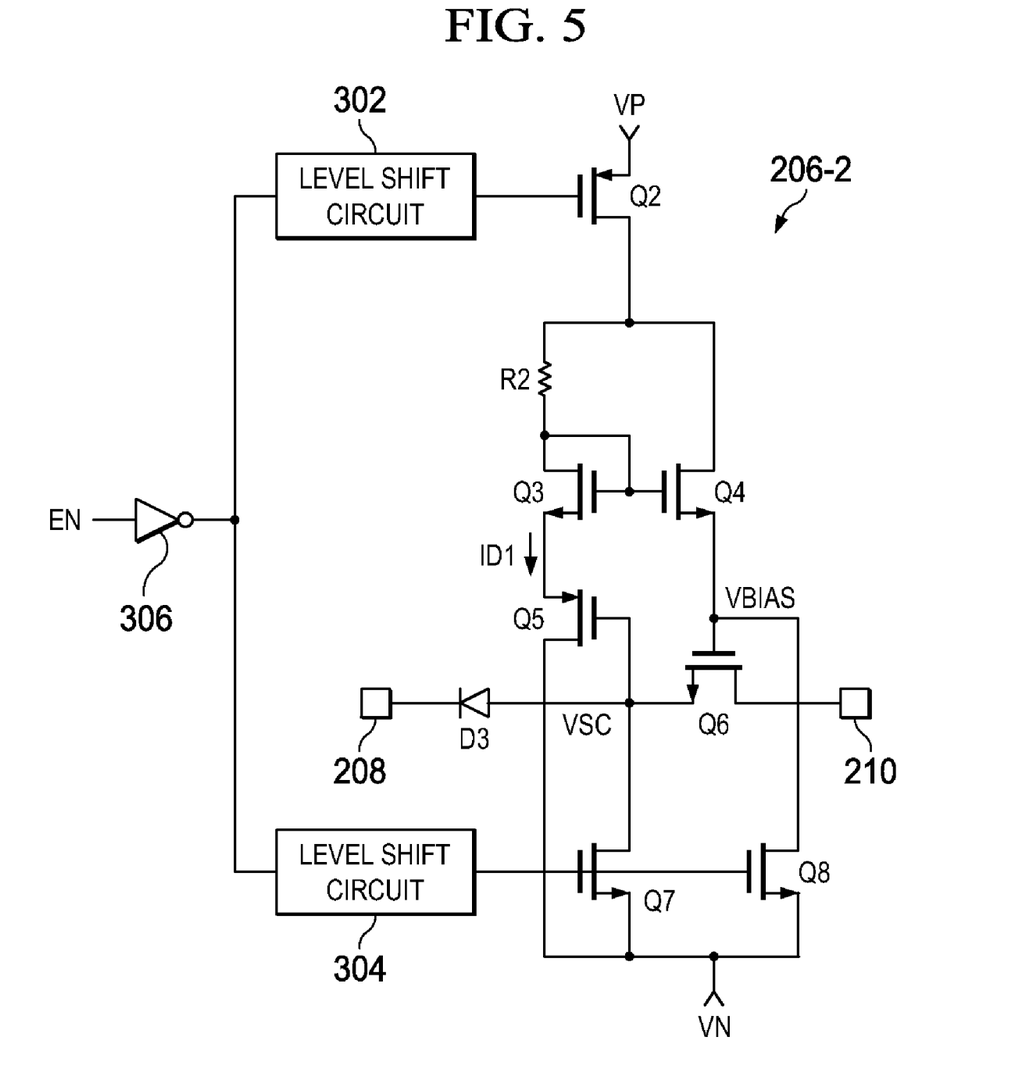
FIGS. 5 and 6 are circuit diagrams of examples of the charge sharing circuit of FIG. 2.

Turning to FIG. 5, another example of current sharing circuit 206 (referred to as 206-2) can be seen. Circuit 206-2 is similar to the circuit 206-1. However, transistor Q9 of circuit 206-1 is replaced with a diode D3. The diode D3 may be diode coupled NMOS transistor and provides that charge sharing is possible from pin 210 to pin 208. Additionally, diode D3 may also be useful for implementing different slew rates for charge sharing from capacitor C1 to C2 with respect to charge sharing from capacitor C2 to C1.

Figure 6:
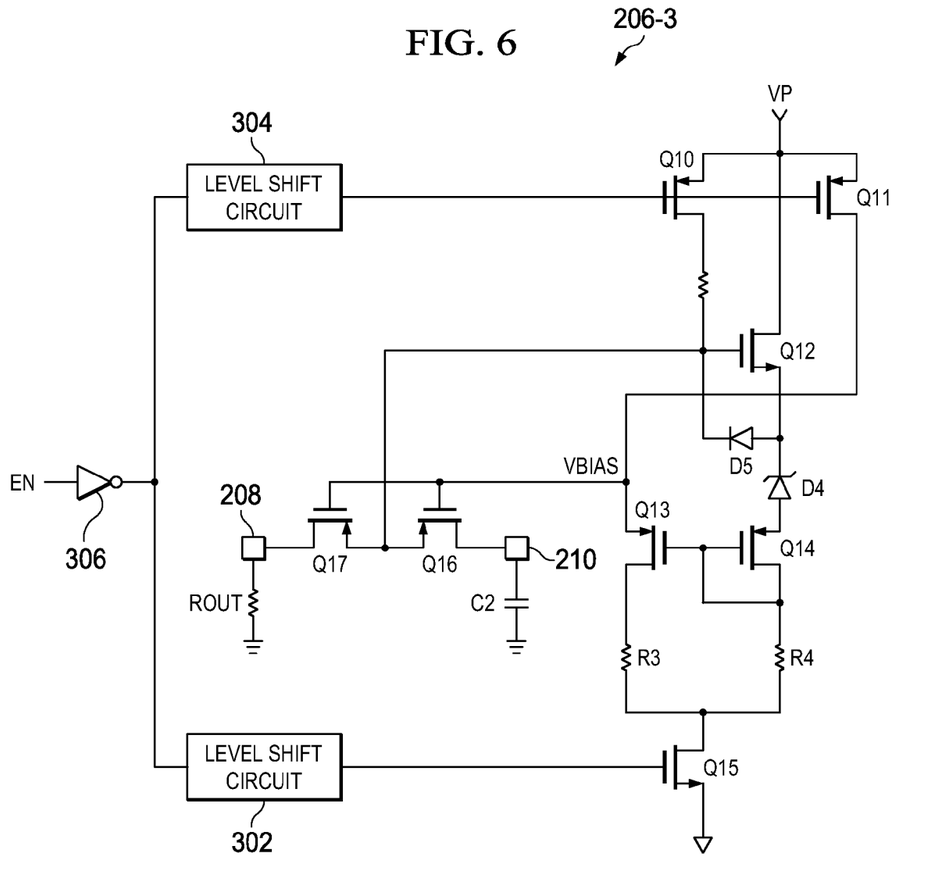

Turning to FIG. 6, another example of current sharing circuit 206 (referred to as current sharing circuit 206-3) can be seen. Circuit 206-3 is similar to circuit 206-1, but circuit 206-3 uses PMOS transistors and includes some further modifications which may also be used for circuit 206-1. Here, the pass-transistors Q16 and Q17 are PMOS transistors having the gate to source voltage difference VBIAS−VSG automatically biased through the remaining portion of the circuit 206-3. The sources of the pass-transistors Q16 and 17 are coupled together and to the gate of transistor Q12. Transistor Q12 is an NMOS transistor and coupled with its drain to the positive supply voltage VP. The source of transistor Q12 is coupled to current mirror (transistors Q13 and Q15). Additionally, the source of transistor Q12 is coupled through a Zener diode D4 to the current mirror (transistors Q13 and Q15). The Zener diode D4 is optional and can be used to increase the overdrive gate voltage of the pass-transistors Q16 and Q17. The voltage at the source of transistor Q14 is mirrored to the source of transistor Q13 (both transistors Q13 and Q14 are PMOS transistors). The voltage at the source of transistor Q13 is then used as voltage VBIAS for controlling the gates of the pass-transistors Q16 and Q17. Resistors R3 and R4 and diode D5 are optional and may preferably be included in order to establish improved electrostatic discharge (ESD) protection. Transistors Q15, Q10, and Q11 serve to disable and enable the charge sharing circuit 206-3, since transistors Q15, Q10, and Q11 are coupled to level shifters 304 and 304. Transistor Q15 may, alternatively, be coupled to ground level instead of the negative supply voltage VN, and it may then be possible to drive transistor Q15 without a level shifter. Additionally, because of the use of resistor ROUT, capacitor C2 may be discharged through resistor ROUT.

Resistor R4 corresponds to resistor R2 of FIG. 3 and serves to limit the steering current ID1. Similar to resistor R1 of FIG. 3, resistor R4 can be dimensioned so as to limit the slew rate of the charge sharing process. Resistor R4 also determines the over drive voltage of transistors Q16 and Q17 through the current ID1. Furthermore, the breakdown voltage of Zener diode D4 further decreases the gate voltage VBIAS with respect to the source voltage VSC. The pass-transistors Q16 and Q17 gate-source voltage VBIAS−VSC may then be determined as:

$$VBIAS-VSC=-(VTH\_Q12+VEFF\_Q12+VTH\_Q14+VEFF\_Q14+VZD4-VTH\_Q13), \quad (3)$$

where VTH is the threshold voltage of the indicated transistor, VEFF is the effective overdrive voltage of the respective transistor, and VZD5 is the breakdown voltage of the Zener diode D4. The overdrive voltage VEFF depends on the current gain β and the current ID1 according to the approximation:

$$VEFF \approx \sqrt{2 \times \frac{ID1}{\beta}} * VZD4. \quad (5)$$

Alternatively, two charge sharing circuits may be used in order to achieve two charge sharing directions. The two charge sharing circuits may then have opposite diode directions (anti parallel). Furthermore, these embodiments can advantageously be configured to have different slew rates in the two directions. One configuration with different slew rates may then have series resistors coupled in series to each of the diodes. The resistors may then have different resistance values in order to achieve different slew rates.

Current sharing circuit 206 may be used where the positive supply voltage VP is up to 30 V or higher. The negative supply voltage VN may be −10 V or lower. Drain extended MOS transistors may also be used as pass-transistors. Drain extended transistors may be used with much higher drain-gate voltages then gate-source voltages. This means that the sources of the pass-transistors are preferably coupled together and away from the pins. Furthermore, for high supply voltages, the breakdown voltage of the Zener diode D0 may be up to several Volt in order to achieve sufficient overdrive.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first pin;
   a second pin;
   a first MOS transistor that receives a first control signal at its gate;
   a current mirror that is coupled to the drain of the first MOS transistor;
   a second MOS transistor that is coupled to the current mirror at its source;
   a pass circuit that is coupled between the first and second pins, wherein the pass circuit is coupled to the current mirror so as to receive a bias voltage, and wherein the pass circuit is coupled to the gate of the second MOS transistor so as to receive a control voltage, and wherein the pass circuit includes:
      a third MOS transistor that is coupled to the first pin at it drain, that is coupled to the current mirror at its gate, and that is coupled to the gate of the second MOS transistor at its source; and
      a fourth MOS transistor that is coupled to the second pin at it drain, that is coupled to the current mirror at its gate, and that is coupled to the gate of the second MOS transistor at its source;
   a fifth MOS transistor that is coupled to the gate of the second MOS transistor at its drain and that receives a second control signal at is gate; and
   a sixth MOS transistor that is coupled to the current mirror so as to receive the bias voltage at its drain and that receives the second control signal at is gate.

2. The apparatus of claim 1, wherein the first, second, fifth, and sixth MOS transistors are first PMOS transistor, a second PMOS transistor, a first NMOS transistor, and a second NMOS transistor, respectively.

3. The apparatus of claim 2, wherein the third and fourth MOS further comprise a third NMOS transistor and a fourth NMOS transistor.

4. The apparatus of claim 1, wherein the first, second, fifth, and sixth MOS transistors are first NMOS transistor, a second NMOS transistor, a first PMOS transistor, and a second PMOS transistor, respectively.

5. The apparatus of claim 4 wherein the third and fourth MOS further comprise a third PMOS transistor and a fourth NMOS transistor.

6. The apparatus of claim 5, wherein the apparatus further comprises a Zener diode that is coupled between the source of second PMOS transistor and the current mirror.

7. The apparatus of claim 1, wherein first and second level shifters provide the first and second control signals.

8. An apparatus comprising:
   a first pin;
   a second pin;
   a first MOS transistor that receives a first control signal at its gate;
   a current mirror that is coupled to the drain of the first MOS transistor;
   a second MOS transistor that is coupled to the current mirror at its source;
   a pass circuit that is coupled between the first and second pins, wherein the pass circuit is coupled to the current mirror so as to receive a bias voltage, and wherein the pass circuit is coupled to the gate of the second MOS transistor so as to receive a control voltage, and wherein the pass circuit includes:
      a diode that is coupled between the gate of the first NMOS transistor and the first pin; and
      a third MOS transistor that is coupled to the second pin at it drain, that is coupled to the current mirror at its gate, and that is coupled to the gate of the first NMOS transistor at its source;
   a fourth MOS transistor that is coupled to the gate of the second MOS transistor at its drain and that receives a second control signal at its gate; and
   a fifth MOS transistor that is coupled to the current mirror so as to receive the bias voltage at its drain and that receives the second control signal at its gate.

9. The apparatus of claim 8, wherein the first, second, fourth, fifth, and third MOS transistors are first PMOS transistor, a second PMOS transistor, a first NMOS transistor, a second NMOS transistor, and a third NMOS transistor, respectively.

10. An apparatus comprising:
    a first pin;
    a second pin;
    a first buffer that is coupled to the first pin and that receives an enable signal and a first output signal, wherein the first buffer enters a high impedance state when the enable signal is asserted;
    a second buffer that is coupled to the second pin and that receives the enable signal and a second output signal, wherein the enters buffer enters the high impedance state when the enable signal is asserted;
    a current sharing circuit having:
       an inverter that receives the enable signal;
       a first level shifter that is coupled to the inverter;
       a second level shifter that is coupled to
       a first MOS transistor that is coupled to the first level shifter at its gate;
       a current mirror that is coupled to the drain of the first MOS transistor;
       a second MOS transistor that is coupled to the current mirror at its source;
       a pass circuit that is coupled between the first and second pins, wherein the pass circuit is coupled to the current mirror so as to receive a bias voltage, and wherein the pass circuit is coupled to the gate of the second MOS transistor so as to receive a control voltage;
       a third MOS transistor that is coupled to the gate of the second MOS transistor at its drain and that is coupled to the second level shifter at is gate; and
       a fourth MOS transistor that is coupled to the current mirror so as to receive the bias voltage at its drain and that receives the second control signal at is gate.

11. The apparatus of claim 10, wherein the first, second, third, and fourth MOS transistors are first PMOS transistor, a second PMOS transistor, a first NMOS transistor, and a second NMOS transistor, respectively.

12. The apparatus of claim 11, wherein the pass circuit further comprises:
    a third NMOS transistor that is coupled to the first pin at it drain, that is coupled to the current mirror at its gate, and that is coupled to the gate of the second PMOS transistor at its source; and a fourth NMOS transistor that is coupled to the second pin at it drain, that is coupled to the current mirror at its gate, and that is coupled to the gate of the second PMOS transistor at its source.

13. The apparatus of claim 11, wherein the pass circuit further comprises:
   a diode that is coupled between the gate of the first NMOS transistor and the first pin; and
   a fifth NMOS transistor that is coupled to the second pin at it drain, that is coupled to the current mirror at its gate, and that is coupled to the gate of the first NMOS transistor at its source.

14. The apparatus of claim 10, wherein the first, second, third, and fourth MOS transistors are first NMOS transistor, a second NMOS transistor, a first PMOS transistor, and a second PMOS transistor, respectively.

15. The apparatus of claim 14, wherein the pass circuit further comprises:
   a third PMOS transistor that is coupled to the first pin at it drain, that is coupled to the current mirror at its gate, and that is coupled to the gate of the second NMOS transistor at its source; and
   a fourth NMOS transistor that is coupled to the second pin at it drain, that is coupled to the current mirror at its gate, and that is coupled to the gate of the second NMOS transistor at its source.

16. The apparatus of claim 15, wherein the apparatus further comprises a Zener diode that is coupled between the source of second PMOS transistor and the current mirror.

* * * * *